United States Patent [19]

Madden et al.

[11] Patent Number: 4,916,350
[45] Date of Patent: Apr. 10, 1990

[54] SENSOR FOR DETECTING VIBRATIONS IN A PLANE, PARTICULARLY IN A STRINGED MUSICAL INSTRUMENT

[76] Inventors: Allan C. Madden, 1103 Canada Rd., Woodside, Calif. 94062; Robert G. Bennett, 444 Wattle Street, Ultimo, NSW 2007, Australia; Robert Cellucci, 563 Everett St., Danville, Calif. 94526; Duncan R. Mackay, 967-4 Belmont Ter., Sunnyvale, Calif. 94086

[21] Appl. No.: 193,412
[22] Filed: May 12, 1988
[51] Int. Cl.$^4$ .................. H01L 41/08; G10H 3/00
[52] U.S. Cl. .................. 310/338; 84/DIG. 24; 84/230
[58] Field of Search .................. 310/330–332, 310/328, 329, 338, 339; 84/1.14, 1.16, DIG. 24

[56] References Cited

U.S. PATENT DOCUMENTS

| | | | |
|---|---|---|---|
| 4,020,448 | 4/1977 | Corbett | 310/338 X |
| 4,126,801 | 11/1978 | Corbett | 310/338 X |
| 4,144,747 | 3/1979 | Datwyler, Jr. | 310/338 X |
| 4,239,088 | 12/1980 | Check et al. | 310/338 X |
| 4,703,216 | 10/1987 | Corbett | 310/338 |

Primary Examiner—Mark O. Budd
Attorney, Agent, or Firm—Limbach, Limbach & Sutton

[57] ABSTRACT

An improved sensor for detecting vibrations uses a flexible moving beam supported by two flexible leg members. The flexible moving beam can be moved in two directions. A protrusion extends from near one end of the flexible moving beam. The protrusion is placed against a transducer element 22 which is against a rest element 24. When the moving beam is moved parallel to its length, the protrusion is pushed against the transducer element 22 and against the rest element 24, thereby generating electrical signals. When the moving beam detects vibrations in a direction perpendicular to its length, the protrusion is rotated upward and outward and pushes against the transducer element 22, causing the generation of electrical signal. The improved sensor is particularly adapted for detecting vibrations from a stringed musical instrument.

7 Claims, 1 Drawing Sheet

SENSOR FOR DETECTING VIBRATIONS IN A PLANE, PARTICULARLY IN A STRINGED MUSICAL INSTRUMENT

TECHNICAL FIELD

The present invention relates to an improved sensor for detecting vibrations in a plane. More particularly, the present invention relates to a sensor that is suited to detect vibrations in a stringed musical instrument.

BACKGROUND OF THE INVENTION

There are many situations in which mechanical vibrations need to be accurately transduced to electrical signals. Various techniques have been used for detecting vibrations in a single direction (e.g., piezo electric, strain gauge, etc). Such systems usually constrain the moving body in the plane of two orthogonal coordinates but allow it to move freely in the third orthogonal direction. Thus, these systems detect vibrations in one direction.

There are other situations where vibrations in a plane need to be transduced, in which case the moving body needs to be fixed in one direction but allowed to vibrate freely in the other two directions. This is the case for a vibration transducer for a guitar string or a stringed musical instrument.

It is well known that a guitar string when picked (i.e., plucked) initially vibrates in the direction of the picking action, but it then gradually precesses away from that direction into a direction 90° away and eventually back to the original direction. This precession around an ellipse is described in Rayleigh's 1877 classic, "The Theory of Sound", Dover 1945.

Various electro-magnetic sensors have been built for guitar strings (see U.S. Pat. Nos. 4,378,722—Isakson and 3,571,483—Davidson). But these do not transduce high frequency signals well because of the inductance of the coil pickups.

Nourney in U.S. Pat. Nos. 4,228,715 and 4,292,875 discloses using a multiplicity of strain gauges to transduce string vibrations. The strain gauges also transduce the longitudinal vibrations of the string which occur at double the fundamental frequency of vibration. It is believed that such arrangements are not practicable because strain gauges are very difficult to mount reliably and because of the need for temperature compensation circuitry. Moreover, a transducer for use in accurately controlling a remote synthesizer should be insensitive to the double frequency caused by the longitudinal vibrations.

Another U.S. Pat. No. 3,453,920 (Scherer) discloses the use of one or two piezo-electric elements arranged under the string support. If the two piezo-electric elements are arranged with opposing polarities they become, in theory, insensitive to vertical motion while transducing horizontal motion. We found this not to be true due to mismatching of the piezo-electric elements and also because of difficulties in mounting the miniature piezos in such a way as to prevent shear stresses, which in turn generate extraneous voltages.

SUMMARY OF THE INVENTION

A vibrating object makes contact with the center of the top beam of a metal parallelogram, with thin vertical sides or legs. The bottom beam of the parallelogram is fixed rigidly. The top beam is free to move side-to-side under horizontal vibrations, due to the flexibility of the thin vertical legs. A protrusion extending from the top beam pushes on a force-sensitive transducer element. The top beam can also deflect under vertical vibrations. This deflection imparts a rotary motion to the protrusion. This imparts a force on the force-sensitive transducer element.

DETAILED DESCRIPTION OF THE DRAWINGS

Figure 1:
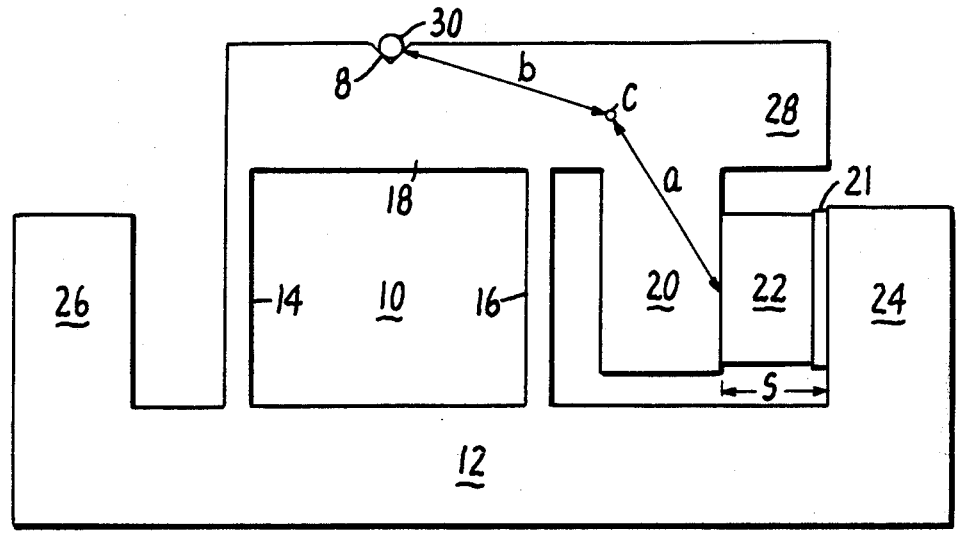
FIG. 1 is a side view of the improved sensor of the present invention.

Referring to the drawing, there is shown an improved sensor 10 of the present invention. The improved sensor 10 comprises a rigid foundation beam 12. A pair of flexible leg members 14 and 16 are positioned substantially parallel to one another with each of the flexible leg members being attached at one end thereof, substantially at right angles to the foundation beam 12. A flexible moving beam 18 is attached to the other end of the two flexible leg members 14 and 16. The two flexible leg members 14 and 16 support the flexible moving beam 18. The flexible moving beam 18, together with the two flexible leg members 14 and 16 and the rigid foundation beam 12 form substantially a parallelogram.

A protrusion 20 extends substantially from one end of the flexible moving beam 18. The protrusion 20 is substantially parallel to the flexible leg members 14 and 16. As will be discussed hereinafter, the protrusion 20 moves in response to the movement of the flexible moving beam 18. A force sensitive transducer element 22 generates an electrical signal in response to a force supply thereto. The transducer element 22 is positioned immediately adjacent to and contiguous with the protrusion 20. A fixed rest element 24 is attached to the rigid foundation beam 12 and is positioned immediately adjacent to and contiguous with the transducer element 22. Thus, in response to vibrations detected by the flexible moving beam 18, causing the protrusion 20 to move, the protrusion 20 moves the transducer element 22 against the rest element 24, causing the generation of the electrical signal. In one embodiment, if the rest element 24 and the protrusion 20 are made of metal, then an insulating sheet 21 is interposed between the transducer element 22 and the rest element 24.

The rest element 24 serves to rigidly support the foundation beam 12 of the sensor 10 at one end thereof. A support element 26 rigidly supports the foundation beam 12 of the sensor 10 at another end thereof. In one particular application, where the sensor 10 is used to detect the vibration of a musical instrument, such as a guitar string, the sensor 10 is positioned in a slot in a guitar bridge such that the rest element 24 and the support element 26 support the sensor 10 therein. In that application, a groove 8 is cut in the moving beam 18. One string 30 of the guitar is positioned in the groove 8.

Figures 2, 3:
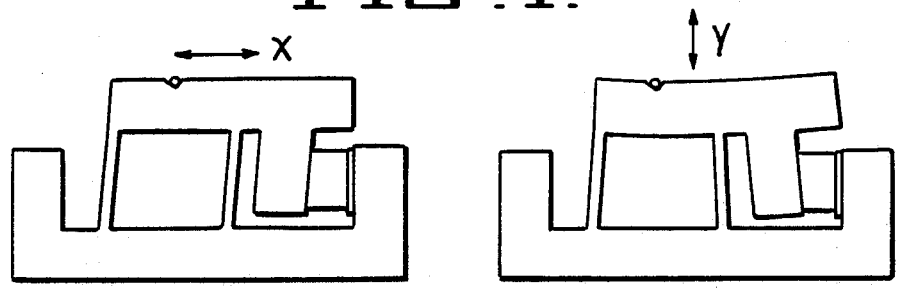
FIG. 2 is a side view of the improved sensor of the present invention, transducing horizontal motion.
FIG. 3 is a side view of the improved sensor of the present invention, transducing vertical motion.

Referring to FIG. 2, there is shown greatly exaggerated the improved sensor 10 of the present invention detecting vibrations in a direction parallel to the length of the moving beam 18. As can be seen in FIG. 2, when the string 30 moves in the x direction, it causes the moving beam 18 and the protrusion 20 to move in the x direction. This causes the protrusion 20 to force the transducer element 22 against the rest element 24. This causes the transducer element 22 to generate an electrical signal in response thereto. Due to the flexibility of the leg members 14 and 16, the vibrations of the string 30 in the x direction are translated directly into the movement of the protrusion 20 in the x direction.

Referring to FIG. 3, there is shown greatly exaggerated the improved sensor 10 for detecting vibrations by the string 30 in a direction substantially perpendicular to the moving beam 18. In this case, the string 30 is vibrating in the y direction. Since the moving beam 18 is flexible, vibrations of the string 30 in the y direction cause the moving beam 18 to vibrate also in the y direction, which is parallel to the length of the flexible leg members 14 and 16. Since the protrusion 20 is attached substantially at one end of the flexible moving beam 18, the movement of the flexible moving beam 18 causes the protrusion 20 to rotate about the fulcrum point C outward and upward and to push the transducer element 22 against the rest element 24. The fulcrum point C is located approximately at the other end of the flexible leg member 16. If the distance from the center of the transducer element 22 to the fulcrum C ("a" as shown in FIG. 1) is set approximately equal to the distance from the fulcrum C to the center of the moving beam 18 (shown as "b" in FIG. 1), then the downward force on the flexible beam 18, i.e., force in the y direction, transfers approximately equally to the transducer 22.

Figure 4:
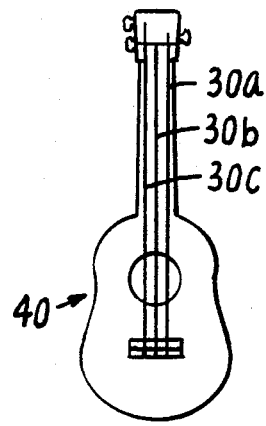
FIG. 4 is a top partial view of a guitar adapted to use the improved sensor of the present invention.

Thus, with the dimensions chosen appropriately, the improved sensor 10 can be made to have equal response in both the vertical; i.e., y, and the horizontal; i.e., x, directions. For use with a guitar string, the improved sensor 10 of the present invention is typically placed in the bridge of the guitar. Referring to FIG. 4, there is shown a top partial view of a guitar 40 with a plurality of strings 30a, 30b, and 30c.

Figure 5:
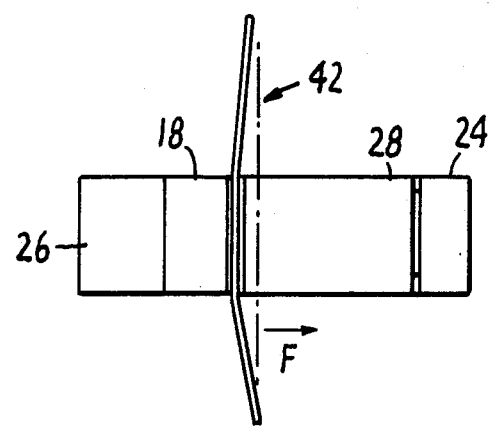
FIG. 5 is a greatly enlarged view of a portion of the guitar shown in FIG. 4, showing the pretension of the guitar string as applied against the sensor of the present invention.

When the strings 30a, 30b, and 30c are at rest and without the sensor 10 of the present invention being inserted on the guitar, they would take the position 42 shown in FIG. 5 (as a dotted line). However, when the sensor 10 is installed, the string 30 is pulled to one side of the sensor 10, the side closer to the support element 26. This supplies a force F in the direction shown by the arrow. The force F causes a pre-tension to be applied to the flexible moving beam 18 to push the protrusion 20 against the transducer element 22. Further in a preferred embodiment, the transducer element 22 has a width "s" which is greater than the distance of separation between the protrusion 20 and the rest element 24. Also, the vertical downward pressure of the string on the flexible moving beam 18 is of the order of 20–40 pounds, and causes the flexible moving beam 18 to deflect and rotate the protrusion 20 outwards and upwards, causing an extra pre-tension of the transducer element 22. Thus, the transducer element 22 in the rest position is under a pre-tension.

As can be seen from FIG. 1, in the preferred embodiment, the protrusion has a lip portion 28 extending from it for the insertion of the transducer element 22. If a force is applied in a horizontal direction to the lip portion 28, the space between the protrusion 20 and the rest element 24 can be opened up to allow easy insertion of the transducer element 22. After the transducer element 22 has been inserted and the said horizontal force removed, the protrusion 20 tends to return to its original position. Because the width (shown as "s" in FIG. 1) of the transducer element 22 is larger than the space between the rest position of the protrusion 20 and the rest element 24, the transducer element 22 is firmly clamped and a pretension is then applied to the transducer element 22.

In the preferred embodiment, the improved sensor 10 is made of phosphor-bronze and has the present dimensions (all of which are expressed as inches):

Leg elements 14 and 16 each has a length of 0.080 and a width of 0.016.

Foundation beam 12 has a length of 0.310 and a depth of 0.040.

Rest element 24 has a length of 0.100 and a width of 0.040.

Support element 26 has a length of 0.100 and a width of 0.040.

Moving beam 18 has a length of 0.180 and a depth of 0.040.

Protrusion 20 has a length of 0.115 and a width of 0.040.

Distance of separation between the protrusion 20 and the rest element 24 is 0.030. The sensor is cut from plate 0.093 thick, so all the above elements have a thickness of 0.093.

Transducer element 22 is made of piezo-electric ceramic and has a width of 0.032 and a diameter of 0.062.

In another preferred embodiment, the improved sensor 10 is made of titanium.

The improved sensor 10 can be made by stacking a plurality of metal sheets on top of one another and then using lasers or electric discharge machinery to manufacture simultaneously a plurality of such improved sensors 10.

For controlling a synthesizer, six separate transducers are used. Further, the present invention can be used for other multiple string or multiple sensor applications. Further, it can be seen that the sensor of the present invention 10 can be used in manner other than to detect the vibration of a string.

What is claimed is:

1. A sensor for detecting vibrations in two dimensions in a plane, comprising:
   a rigid foundation beam having a length;
   two flexible leg members, each having two ends, positioned substantially parallel to one another and attached substantially at right angles to the foundation beam by a first end of each of said flexible leg members each leg member flexible in a direction substantially parallel to said length;
   a flexible moving beam supported by and attached to said two flexible leg members at the second end of each of said flexible leg members, forming substantially a parallelogram said moving beam movable in a direction substantially parallel to said length and is flexible in a direction substantially perpendicular to said length;
   a protrusion extending substantially from one end of said flexible moving beam, with said protrusion moving in response to the moving or the flexing of said flexible moving beam;
   a force-sensitive transducer element for generating an electrical signal in response to a force applied thereto, positioned immediately adjacent to and contiguous with said protrusion; and a fixed rest element attached to said rigid foundation beam, and positioned immediately adjacent to and contiguous with said transducer element;

wherein said transducer element generates said electrical signal in response to vibrations in two dimensions (substantially parallel to and perpendicular to said length) detected by said flexible moving beam causing said protrusion to move said transducer element against said rest element.

2. The sensor of claim 1 wherein vibrations moving in a direction substantially parallel to said flexible moving beam cause said moving beam and said protrusion to move in said direction against said transducer element.

3. The sensor of claim 1 wherein vibrations moving in a direction substantially perpendicular to said flexible moving beam cause said moving beam to deflect in said direction and to cause said protrusion to rotate about said second end of said flexible leg member closest to said transducer element, and to move against said transducer element.

4. The sensor of claim 3 wherein said protrusion rotates about said second end of said flexible leg member in a radius of rotation approximately equal to one half of the length of said flexible moving beam.

5. The sensor of claim 1 further comprising
support elements attached to said foundation beam for rigidly supporting said foundation beam.

6. The sensor of claim 1 wherein said transducer element having a width greater than the distance between said protrusion and said rest element.

7. The sensor of claim 1 wherein said protrusion having a lip portion extending from said flexible moving member.

8. A method of simultaneously manufacturing a plurality of sensors, comprising the steps of:
stacking a plurality of sheets of metal together; and
cutting simultaneously through said plurality of sheets of metal to form said sensors.

9. The method of claim 8 wherein said metal is titanium.

10. The method of claim 8 wherein said metal is phosphor-bronze.

* * * * *